United States Patent
Anderson et al.

(10) Patent No.: US 10,243,073 B2
(45) Date of Patent: Mar. 26, 2019

(54) VERTICAL CHANNEL FIELD-EFFECT TRANSISTOR (FET) PROCESS COMPATIBLE LONG CHANNEL TRANSISTORS

(71) Applicant: International Business Machines Corporation, Armonk, NY (US)

(72) Inventors: Brent A. Anderson, Jericho, VT (US); Steven Bentley, Menands, NY (US); Kwan-Yong Lim, Niskayuna, NY (US); Hiroaki Niimi, Cohoes, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/241,408

(22) Filed: Aug. 19, 2016

(65) Prior Publication Data

US 2018/0053843 A1 Feb. 22, 2018

(51) Int. Cl.
| | |
|---|---|
| H01L 21/336 | (2006.01) |
| H01L 29/78 | (2006.01) |
| H01L 29/66 | (2006.01) |
| H01L 29/423 | (2006.01) |
| H01L 27/088 | (2006.01) |
| H01L 21/8234 | (2006.01) |

(52) U.S. Cl.
CPC .. H01L 29/7827 (2013.01); H01L 21/823412 (2013.01); H01L 21/823487 (2013.01); H01L 27/088 (2013.01); H01L 29/4236 (2013.01); H01L 29/66636 (2013.01); H01L 29/66666 (2013.01); H01L 29/78 (2013.01); H01L 21/82345 (2013.01); H01L 21/823456 (2013.01)

(58) Field of Classification Search
CPC ............... H01L 21/82345; H01L 21/823487
USPC ........................... 438/156, 271, 596
See application file for complete search history.

(56) References Cited

U.S. PATENT DOCUMENTS

| | | |
|---|---|---|
| 5,128,272 A | 7/1992 | Ramde |
| 5,326,711 A | 7/1994 | Malhi |

(Continued)

FOREIGN PATENT DOCUMENTS

| | | |
|---|---|---|
| CA | 1271266 A1 | 7/1990 |
| WO | 02086904 A3 | 10/2002 |

(Continued)

OTHER PUBLICATIONS

Anderson et al.; U.S. Appl. No. 14/975,168, filed Dec. 18, 2015; Entitled "Vertical Transistor Fabrication and Devices".

(Continued)

*Primary Examiner* — Chandra Chaudhari
(74) *Attorney, Agent, or Firm* — Alexa L. Ashworth; Brian M. Restauro

(57) ABSTRACT

Embodiments of the present invention provide methods and systems for co-integrating a short-channel vertical transistor and a long-channel transistor. One method may include: from a starting substrate, forming a wide fin, wherein the wide fin comprises a wide active region; depositing a recess mask over a top surface of the starting substrate; recessing a long channel based on the deposited recess mask; depositing a gate electrode and a gate material, to form a gate structure; and forming SD contacts in an SD region of the long-channel transistor.

10 Claims, 17 Drawing Sheets

(56) References Cited

U.S. PATENT DOCUMENTS

| | | |
|---|---|---|
| 5,416,736 A | 5/1995 | Kosa et al. |
| 5,773,343 A | 6/1998 | Lee et al. |
| 6,104,061 A | 8/2000 | Forbes et al. |
| 6,150,210 A | 11/2000 | Arnold |
| 6,194,773 B1 | 2/2001 | Malhi |
| 7,560,728 B2 | 7/2009 | Lin et al. |
| 7,687,339 B1 | 3/2010 | Schultz et al. |
| 7,791,068 B2 | 9/2010 | Meng et al. |
| 8,383,477 B2 | 2/2013 | Lee |
| 8,471,310 B2 | 6/2013 | Hynecek |
| 9,048,329 B2 | 6/2015 | Kim et al. |
| 9,117,910 B2 * | 8/2015 | Jeong ............... H01L 29/7855 |
| 9,190,466 B2 | 11/2015 | Basker et al. |
| 9,299,835 B1 | 3/2016 | Anderson et al. |
| 9,607,899 B1 | 3/2017 | Cheng et al. |
| 9,698,145 B1 | 7/2017 | Balakrishnan et al. |
| 2003/0015755 A1 | 1/2003 | Hagemeyer |
| 2008/0157225 A1 | 7/2008 | Datta et al. |
| 2008/0197397 A1 | 8/2008 | Parthasarathy et al. |
| 2008/0283910 A1 * | 11/2008 | Dreeskornfeld ............ H01L 21/823431 438/270 |
| 2009/0057780 A1 | 3/2009 | Wong et al. |
| 2011/0006360 A1 | 1/2011 | Ikebuchi |
| 2011/0233512 A1 | 9/2011 | Yang et al. |
| 2012/0214285 A1 | 8/2012 | Guha et al. |
| 2015/0236094 A1 | 8/2015 | Hsiao et al. |

FOREIGN PATENT DOCUMENTS

| | | |
|---|---|---|
| WO | 2005091376 A1 | 9/2005 |
| WO | 2013123287 A1 | 8/2013 |

OTHER PUBLICATIONS

Anderson et al.; U.S. Appl. No. 14/970,624, filed Dec. 16, 2015; "Variable Gate Lengths for Vertical Transistors".

* cited by examiner

US 10,243,073 B2

VERTICAL CHANNEL FIELD-EFFECT TRANSISTOR (FET) PROCESS COMPATIBLE LONG CHANNEL TRANSISTORS

BACKGROUND OF THE INVENTION

The present invention relates generally to semiconductor devices, and more particularly to the formation of long channel transistors using a vertical-channel field effect transistor (FET) fabrication process.

A field effect transistor (FET) typically has a source region, a channel region, and a drain region, where current flows from the source region to the drain region, and a gate that controls the flow of current through the channel to operate the transistor. A vertical field-effect (FET) transistor has a channel perpendicular to the substrate surface, as opposed to being situated along the plane of the surface of the substrate.

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties. Semiconductor devices include transistors, resistors, capacitors, and the like, with intermediate and overlying metallization patterns at varying levels, separated by dielectric materials, which interconnect the semiconductor devices to form integrated circuits.

To electrically isolate semiconductor devices from each other, various isolation techniques, such as trench isolation structures, have been used. Viewing the vertical direction as into the depth, or thickness, of a given substrate and the horizontal direction as being parallel to a top surface of the substrate, a trench isolation structure is vertically oriented to provide insulating separation between semiconductor devices at different horizontal locations. Traditionally, a semiconductor surface is etched to form separate device regions, and resulting trenches in between the separate device regions are filled with dielectric material to form the trench isolation structures.

SUMMARY

According to one embodiment of the present invention, a method for co-integrating a short-channel vertical transistor and a long-channel transistor, the method comprising: from a starting substrate, forming a wide fin, wherein the wide fin comprises a wide active region; depositing a recess mask over a top surface of the starting substrate; recessing a long channel based on the deposited recess mask; depositing a gate electrode and a gate material, to form a gate structure; and forming SD contacts in an SD region of the long-channel transistor.

According to another embodiment of the present invention, a semiconductor structure, comprising: at least one vertical fin structure on a starting substrate; gate material contacting with the at least one vertical fin structure, wherein the gate material is recessed; and a source and drain region at a side of the at least one vertical fin structure, wherein the source and drain region form a long channel.

DETAILED DESCRIPTION

Figure 1A:
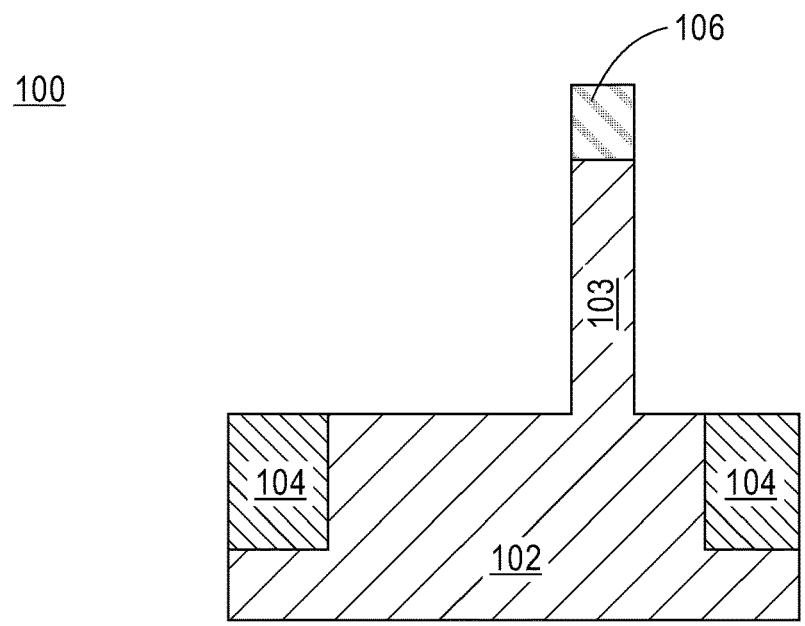
FIGS. 1A and 1B depict cross-sectional views of a beginning vertical channel transistor structure and a beginning recessed channel gate transistor, respectively, after fin formation, in accordance with an embodiment of the present invention.

The fabrication of a long channel transistor may be difficult in a vertical channel transistor device, as taller FINs within one wafer are required to form the long channel, which can be difficult to fabricate. Embodiments of the present invention provide a fabrication process for a recessed channel gate, long channel transistor device using a similar process as that to fabricate a vertical channel transistor (with a short channel). By recessing some part of the wide FIN region, it is possible to form a long channel device.

Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "on", "over", "overlying", "atop", "positioned on", or "positioned atop" mean that a first element, such as a first structure, is present on a second element, such as a second structure, wherein intervening elements, such as an interface structure, may be present between the first element and the second element. The terms "direct contact", "directly on", or "directly over" mean that a first element, such as a first structure, and a second element, such as a second structure, are connected without any intermediary conducting, insulating, or semiconductor layers at the interface of the two elements. The terms "connected" or "coupled" mean that one element is directly connected or coupled to another element, or intervening elements may be present. The terms "directly connected" or "directly coupled" mean that one element is connected or coupled to another element without any intermediary elements present.

Figure 1B:
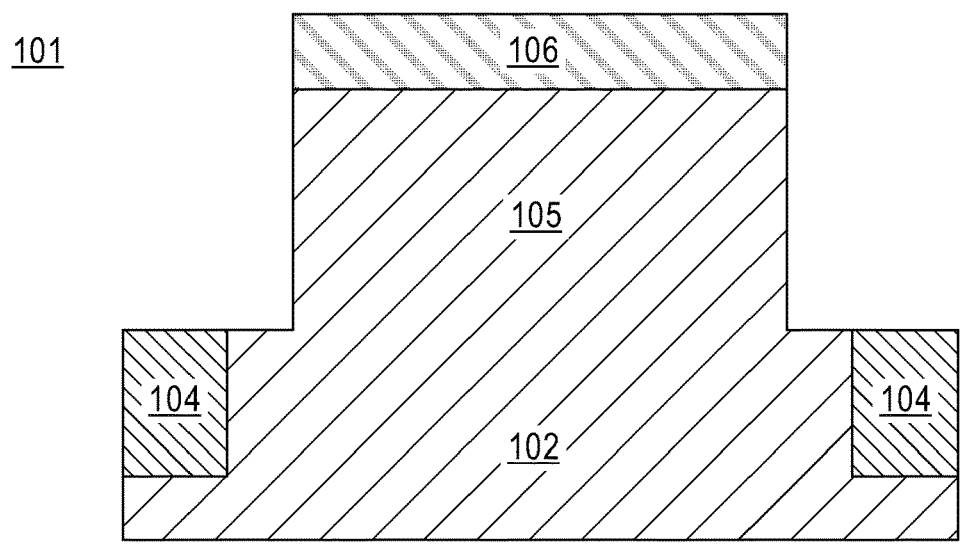

Referring now to the figures, FIGS. 1A and 1B depict cross-sectional views of a beginning vertical channel transistor structure and a beginning recessed channel gate transistor, respectively, after fin formation, in accordance with an embodiment of the present invention.

Structure 100 is a vertical channel transistor and structure 101 is a recessed channel gate transistor. Structure 100 includes substrate 102 having an active region and vertical fin 103, and structure 101 includes substrate 102 having an active region and wide fin 105. Vertical fin 103 and wide fin 105 are formed using a standard deposition, lithography, and etch process, known in the art. For example, hardmask 106 may be deposited using a conventional chemical vapor deposition (CVD) process, over the top surface of substrate 102, and etched using, for example, reactive ion etching (RIE) to form vertical fin 103 on structure 100 and wide fin 105 on structure 101. Subsequent to the formation of vertical fin 103 and wide fin 105, device regions are created through shallow trench isolation (STI) within the starting substrate 102. In a preferred embodiment, the shallow trenches are filled with one or more insulating materials 104, such as $SiO_2$, to isolate fins 103 and 105. This prevents electrical current leakage between adjacent semiconductor device components, preventing one device region from affecting another or shorting out through contact with another. At this processing step, the wide fin 105 of structure 101 is wider in length than that of vertical fin 103 of structure 100.

Figure 2A:
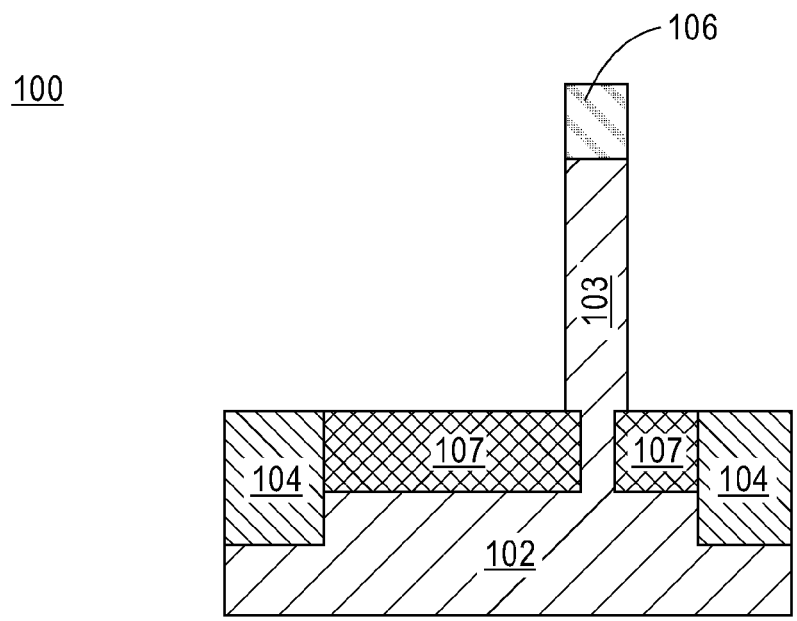
FIGS. 2A and 2B are cross-sectional views of a vertical channel transistor and a recessed channel gate transistor, respectively, depicting the formation of a bottom SD region in the vertical channel transistor, in accordance with an embodiment of the present invention.
Figure 2B:
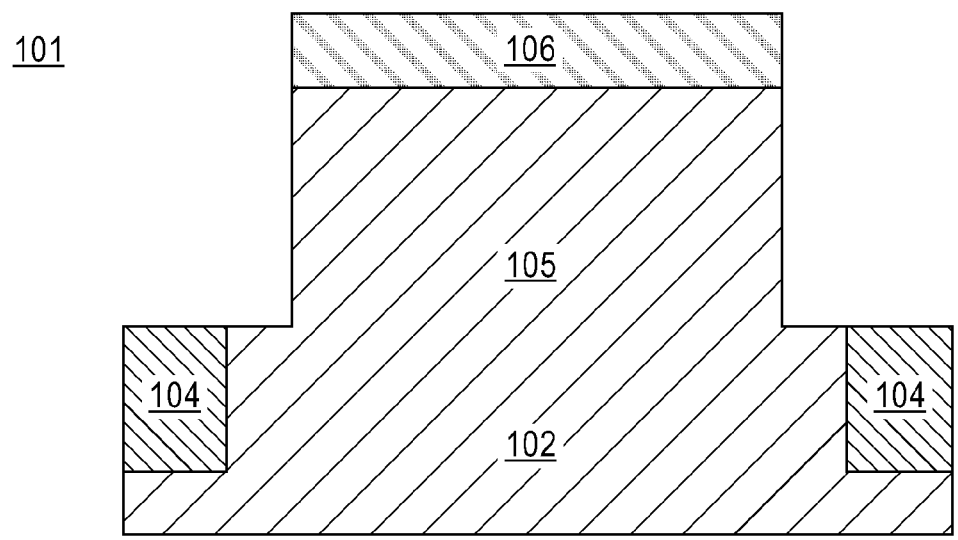

FIGS. 2A and 2B are cross-sectional views of a vertical channel transistor and a recessed channel gate transistor, respectively, depicting the formation of a bottom SD region in the vertical channel transistor, in accordance with an embodiment of the present invention.

In this exemplary embodiment, bottom SD 107 is formed on structure 100, by depositing a dielectric material on the top surface of substrate 102. Bottom SD 107 can be, for example, an oxide material, and in an embodiment, can be blanket deposited over substrate 102 on any exposed surfaces, using a conventional deposition process known in the art (e.g., chemical vapor deposition). At this processing step, no bottom SD is formed in structure 101 (i.e., long channel device).

Figure 3A:
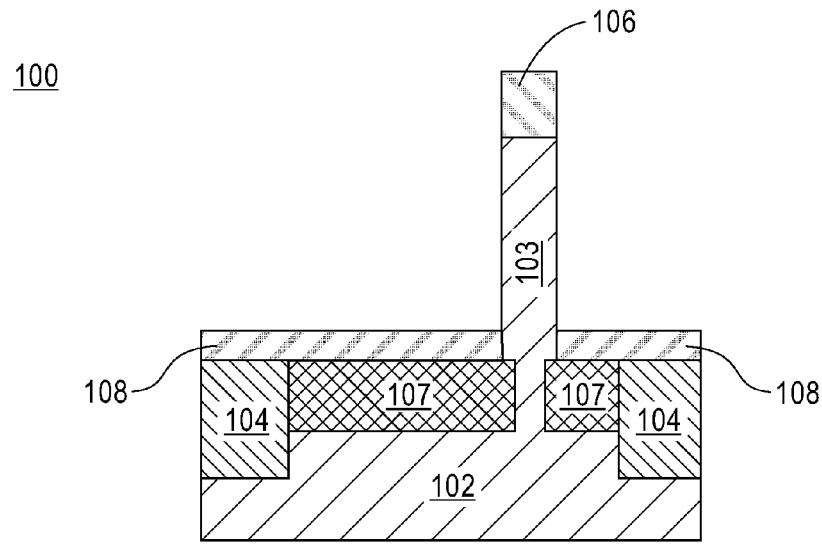
FIGS. 3A and 3B are cross-sectional views of a vertical channel transistor and a recessed channel gate transistor, respectively, depicting the fabrication process of bottom spacer formation, in accordance with an embodiment of the present invention.
Figure 3B:
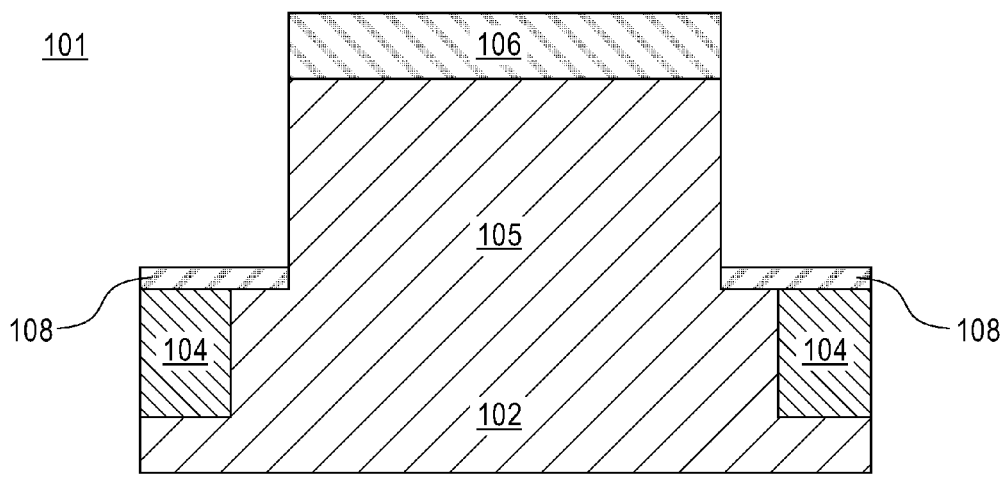

FIGS. 3A and 3B are cross-sectional views of a vertical channel transistor and a recessed channel gate transistor, respectively, depicting the fabrication process of bottom spacer formation, in accordance with an embodiment of the present invention.

In this exemplary embodiment, bottom spacer 108 is optionally deposited over substrate 102 in structures 100 and 101, such that the vertical portion of fins 103 and 105 remains exposed. Bottom spacer 108 can be an oxide material, which can be blanket deposited over the wide fin 105, and on any exposed surfaces of structure 101, using a conventional deposition process. For example, chemical vapor deposition (CVD) can be used.

Figure 4A:
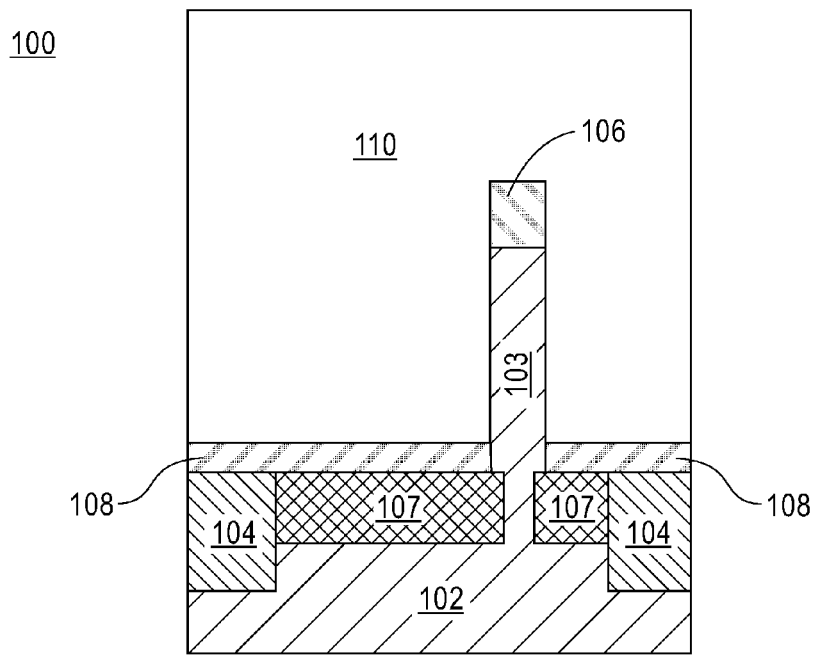
FIGS. 4A and 4B are cross-sectional views of a vertical channel transistor and a recessed channel gate transistor, respectively, depicting the fabrication process of depositing and recessing a mask, in accordance with an embodiment of the present invention.
Figure 4B:
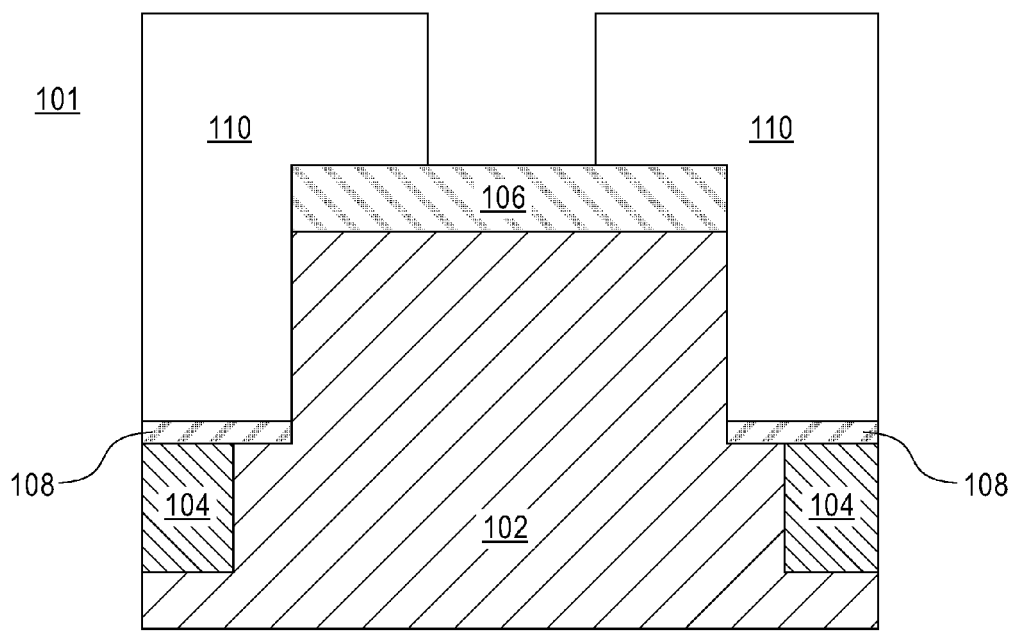

FIGS. 4A and 4B are cross-sectional views of a vertical channel transistor and a recessed channel gate transistor, respectively, depicting the fabrication process of depositing and recessing a mask, in accordance with an embodiment of the present invention.

In this exemplary embodiment, a mask 110 is blanket deposited over the top of structures 100 and 101, and standard lithography and etching processes known in the art are performed in order to etch the region for forming the recessed channel in structure 101. In some embodiments, mask 110 is a tri-layer material, where the first layer is an organic planarization layer (OPL) for a flat topography, followed by a layer above the OPL layer, which can be a silicon anit-reflective coating (SiARC) material, followed by a layer of photoresist material known in the art, above the SiARC layer.

Figure 5A:
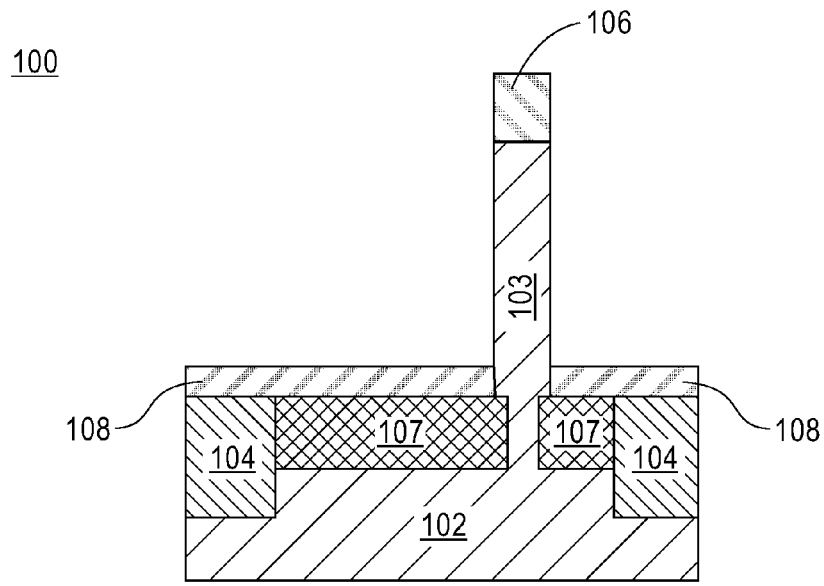
FIGS. 5A and 5B are cross-sectional views of a vertical channel transistor and a recessed channel gate transistor, respectively, depicting the fabrication process of recessing a channel in the recessed channel gate transistor, in accordance with an embodiment of the present invention.
Figure 5B:
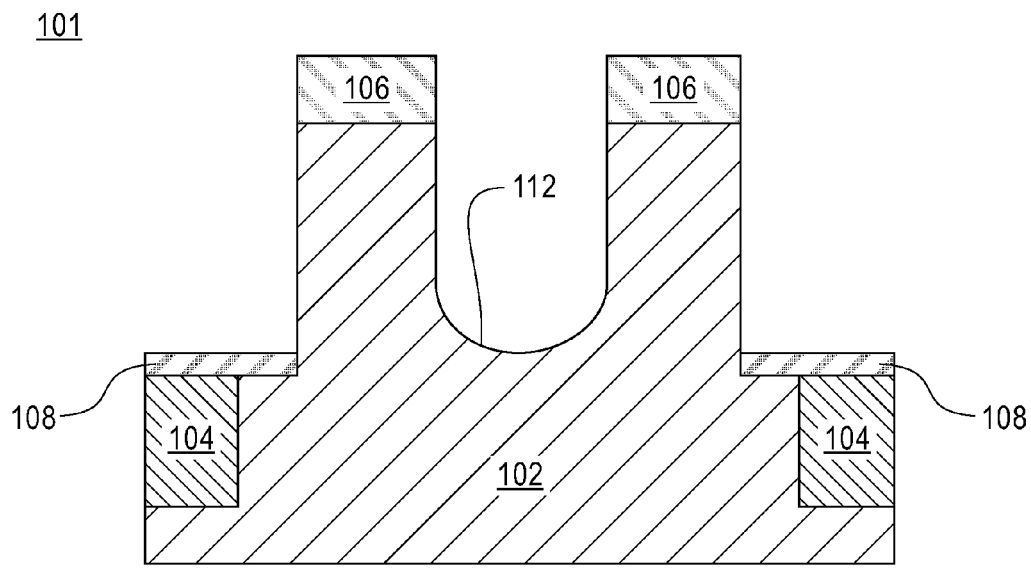

FIGS. 5A and 5B are cross-sectional views of a vertical channel transistor and a recessed channel gate transistor, respectively, depicting the fabrication process of recessing a channel in the recessed channel gate transistor, in accordance with an embodiment of the present invention.

In this exemplary embodiment, recessed channel 112 is formed in structure 101, using standard etching processes known in the art. In some embodiments, recessed channel 112 is etched to align with the top surface of bottom spacer 108. In other embodiments, depending on design requirements, recessed channel 112 can be various combinations of different widths and depths, in order to form a long channel. At this processing step, a recessed channel 112 is formed only in the recessed channel gate transistor (i.e., structure 101), and not in the vertical channel device (i.e., structure 100).

Figure 6A:
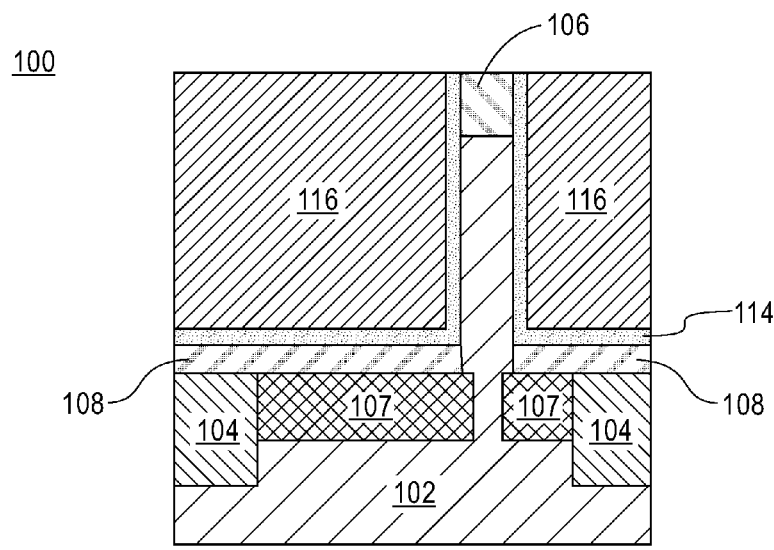
FIGS. 6A and 6B are cross-sectional views of a vertical channel transistor and a recessed channel gate transistor, respectively, depicting the fabrication process of forming gate dielectric material and a gate electrode, in accordance with an embodiment of the present invention.
Figure 6B:
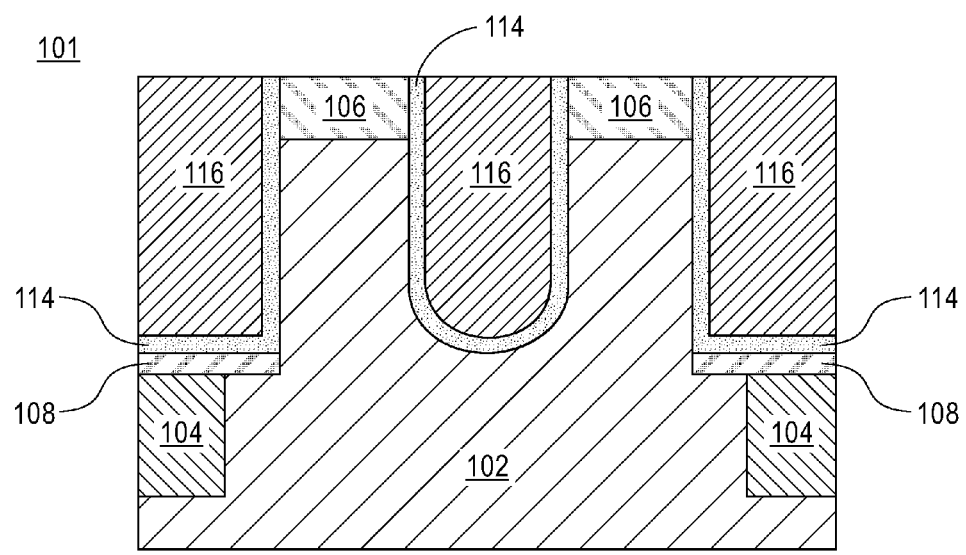

FIGS. 6A and 6B are cross-sectional views of a vertical channel transistor and a recessed channel gate transistor, respectively, depicting the fabrication process of forming gate dielectric material and a gate electrode, in accordance with an embodiment of the present invention.

In this exemplary embodiment, gate dielectric material 114 can be a high-K material, such as a hafnium based material (e.g., hafnium oxide), and wraps around the entire exposed vertical surfaces of vertical fin 103 and wide fins 105 and on the top surface of bottom spacer 108. Gate electrode 116 can be any appropriate metal material or combinations of metal materials, and is deposited over the top surface of gate dielectric material 114. Gate dielectric material 114 and gate electrode 116 can be formed using any conventional deposition process known in the art, for example, CVD.

Figure 7A:
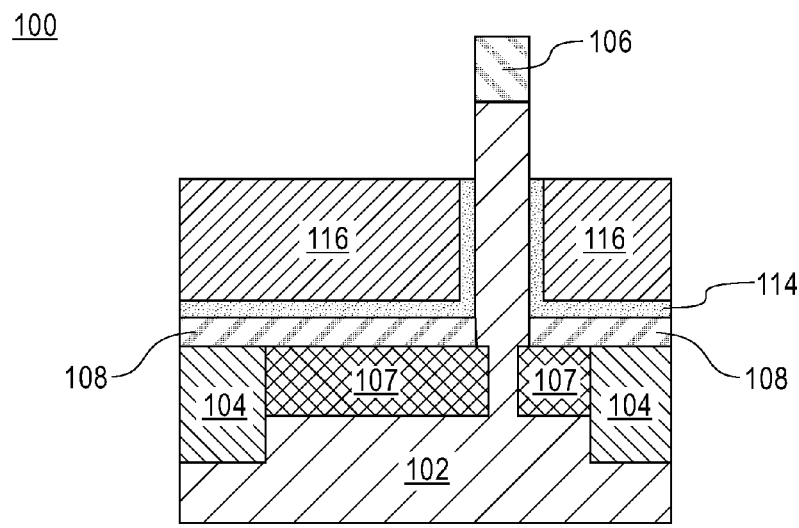
FIGS. 7A and 7B are cross-sectional views of a vertical channel transistor and a recessed channel gate transistor, respectively, depicting the fabrication process of gate electrode recess, in accordance with an embodiment of the present invention.
Figure 7B:
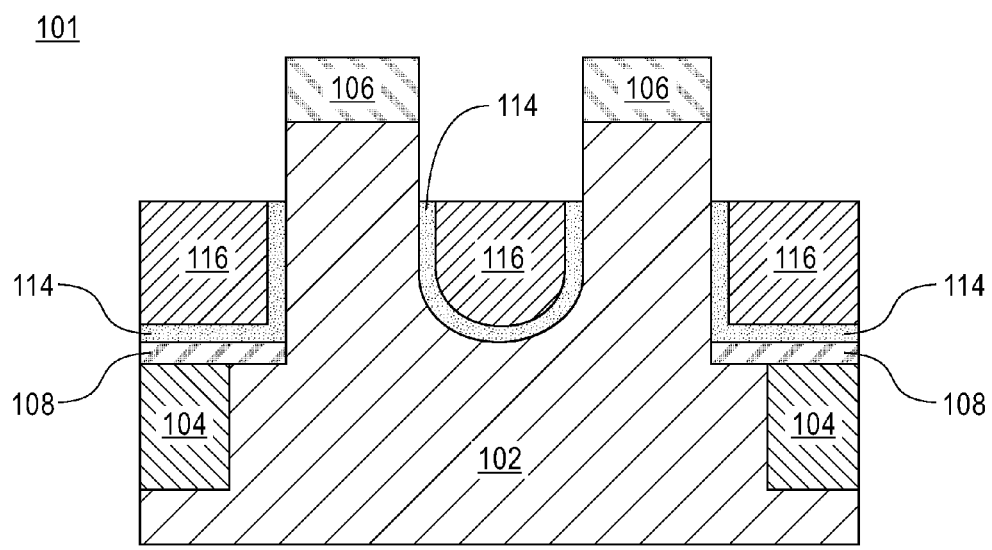

FIGS. 7A and 7B are cross-sectional views of a vertical channel transistor and a recessed channel gate transistor, respectively, depicting the fabrication process of gate electrode recess, in accordance with an embodiment of the present invention.

In this exemplary embodiment, gate dielectric material 114 and gate electrode 116 are etched back to expose a top portion of vertical fin 103 and wide fins 105. In some embodiments, a chemical mechanical process (CMP) can be used to perform the etching process of gate dielectric material 114 and gate electrode 116.

Figure 8A:
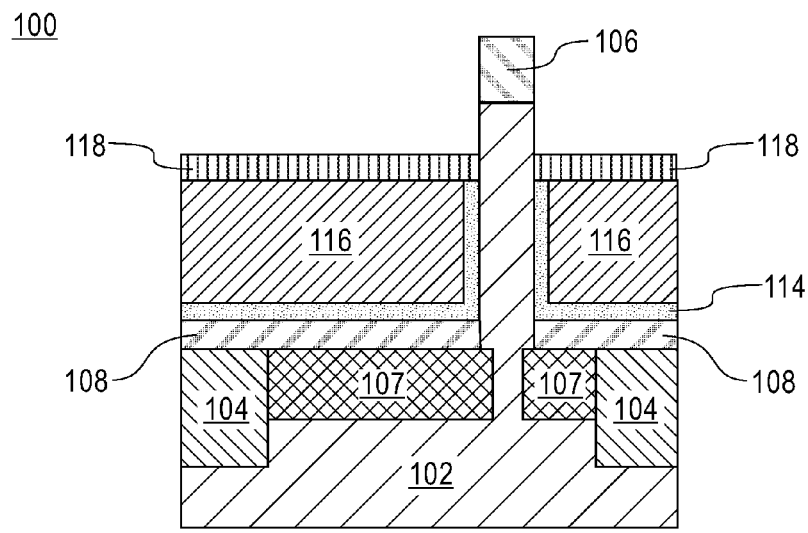
FIGS. 8A and 8B are cross-sectional views of a vertical channel transistor and a recessed channel gate transistor, respectively, depicting the fabrication process of top SD spacer formation, in accordance with an embodiment of the present invention.
Figure 8B:
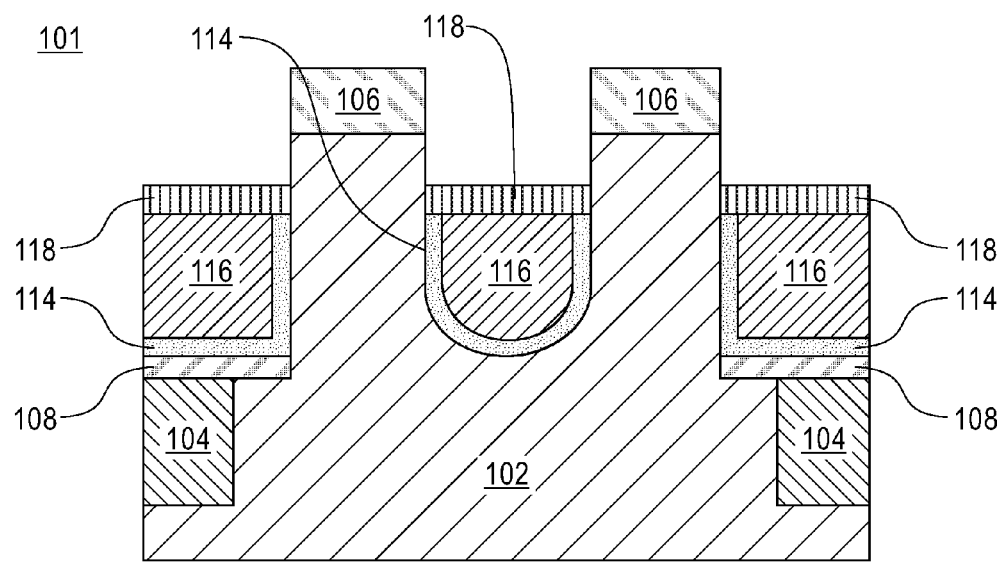

FIGS. 8A and 8B are cross-sectional views of a vertical channel transistor and a recessed channel gate transistor, respectively, depicting the fabrication process of top SD spacer formation, in accordance with an embodiment of the present invention.

In this exemplary embodiment, a top spacer 118 is optionally deposited after the recessing of gate electrode 116. Top spacer 118 may be composed of an oxide or a nitride, and are deposited over the top surface of structures 100 and 101 using deposition processes known in the art.

Figure 9A:
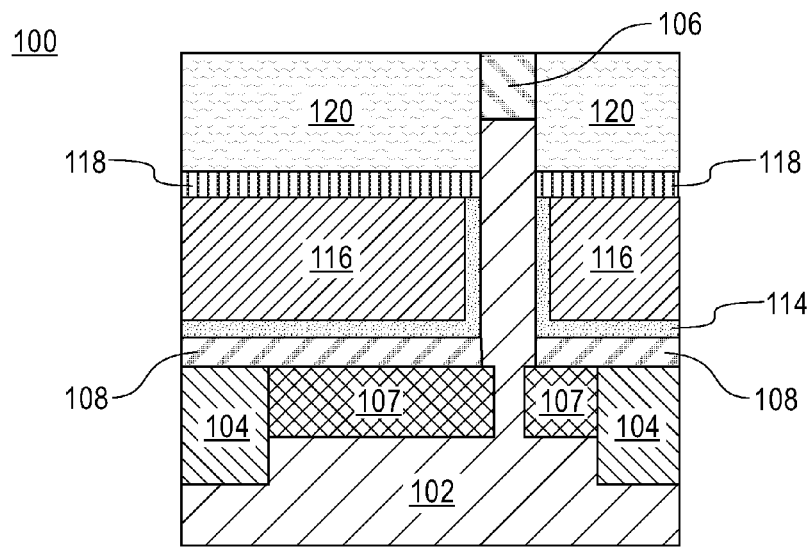
FIGS. 9A and 9B are cross-sectional views of a vertical channel transistor and a recessed channel gate transistor, respectively, depicting the fabrication process of a first ILD fill and CMP, in accordance with an embodiment of the present invention.
Figure 9B:
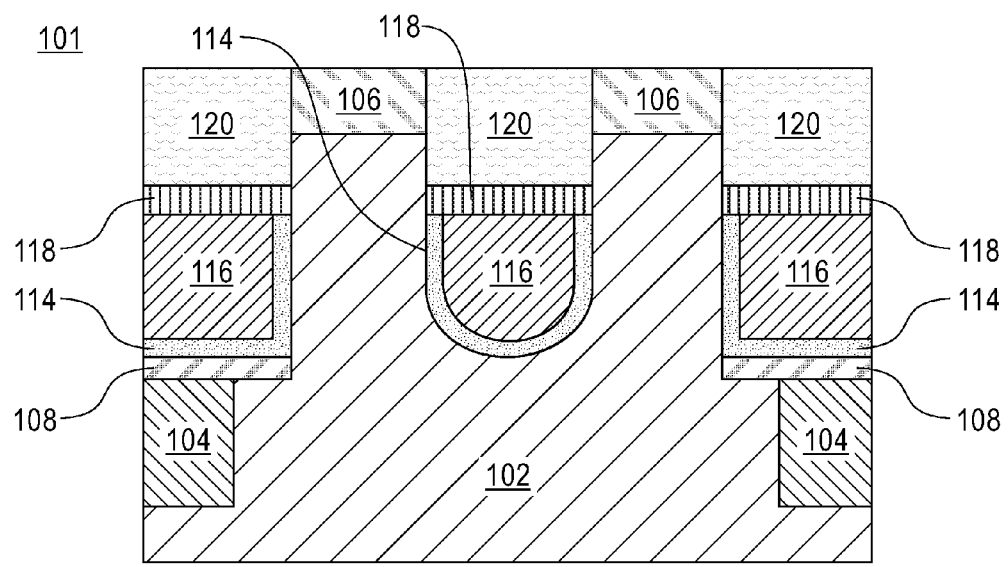

FIGS. 9A and 9B are cross-sectional views of a vertical channel transistor and a recessed channel gate transistor, respectively, depicting the fabrication process of a first ILD fill and CMP, in accordance with an embodiment of the present invention.

In this exemplary embodiment, dielectric material 120 is deposited over the top surface of top spacer 118 in both structures 100 and 101, using a conventional deposition process, followed by a planarization process (e.g., chemical mechanical planarization) to expose the top surface of vertical fin 103 (in structure 100) and wide fins 105 (in structure 101). Dielectric material 120 can be an oxide material, which acts to separate later formed source and drain regions from the gate structure (i.e., gate dielectric material 114 and gate electrode 116).

Figure 10A:
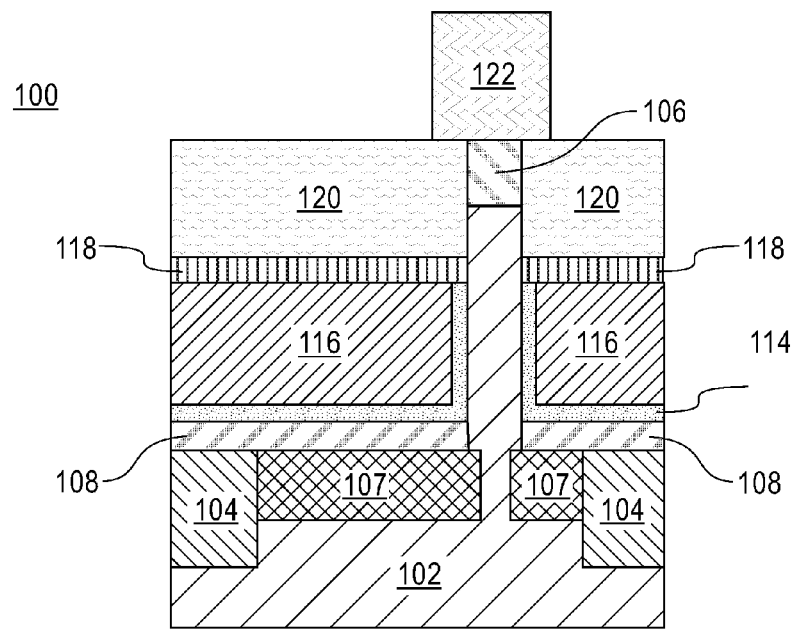
FIGS. 10A and 10B are cross-sectional views of a vertical channel transistor and a recessed channel gate transistor, respectively, depicting the fabrication process of a gate electrode mask deposition, in accordance with an embodiment of the present invention.
Figure 10B:
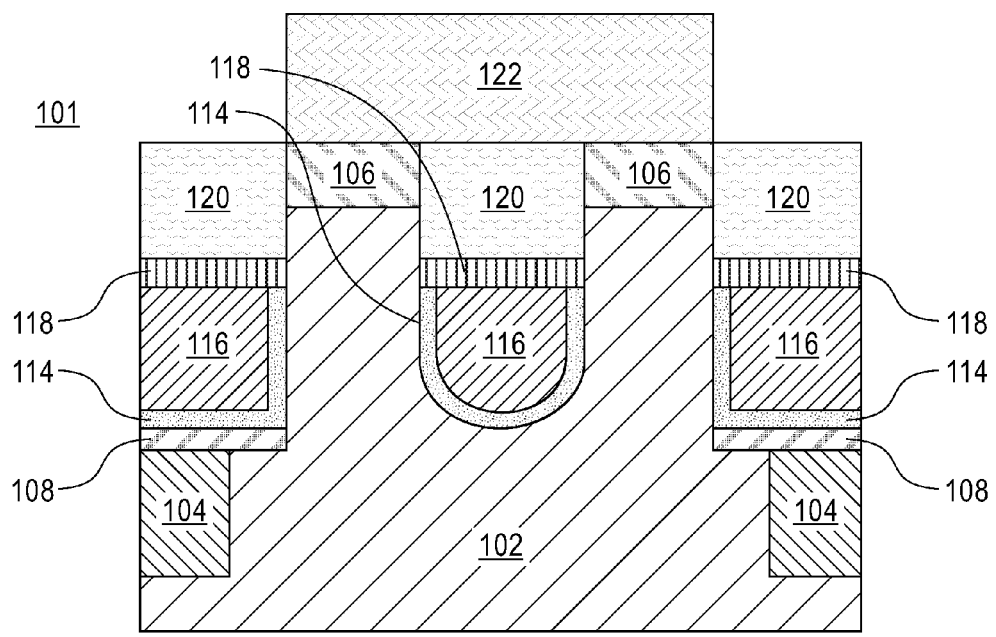

FIGS. 10A and 10B are cross-sectional views of a vertical channel transistor and a recessed channel gate transistor, respectively, depicting the fabrication process of a gate electrode mask deposition, in accordance with an embodiment of the present invention.

In this exemplary embodiment, gate electrode mask 122 is deposited over the top surface of vertical fin 103 (structure 100) and wide fins 105 (structure 101), using conventional deposition processes known in the art, such as CVD. In some embodiments, mask 110 is a tri-layer material, where the first layer is an organic planarization layer (OPL) for a flat topography, followed by a layer above the OPL layer, which can be a silicon anit-reflective coating (SiARC) material, followed by a layer of photoresist material known in the art, above the SiARC layer.

Figure 11A:
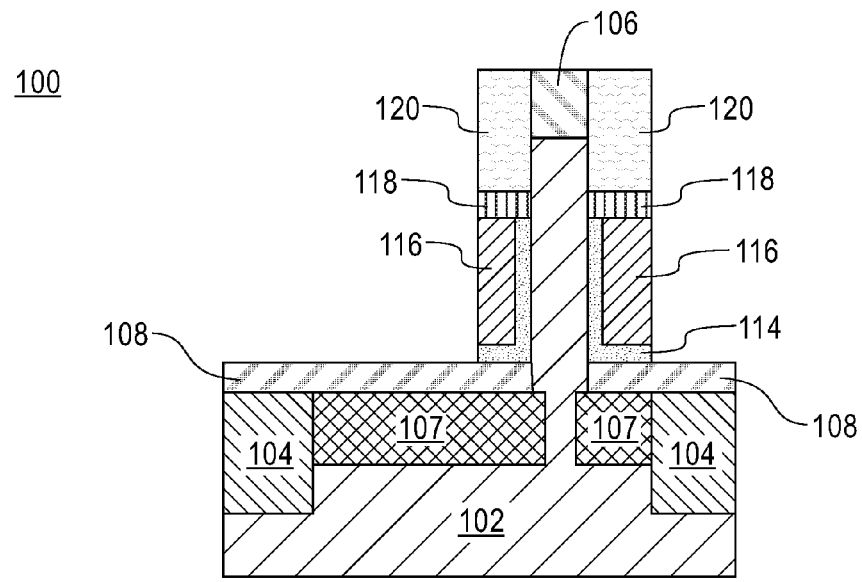
FIGS. 11A and 11B are cross-sectional views of a vertical channel transistor and a recessed channel gate transistor, respectively, depicting the fabrication process of gate electrode patterning, in accordance with an embodiment of the present invention.
Figure 11B:
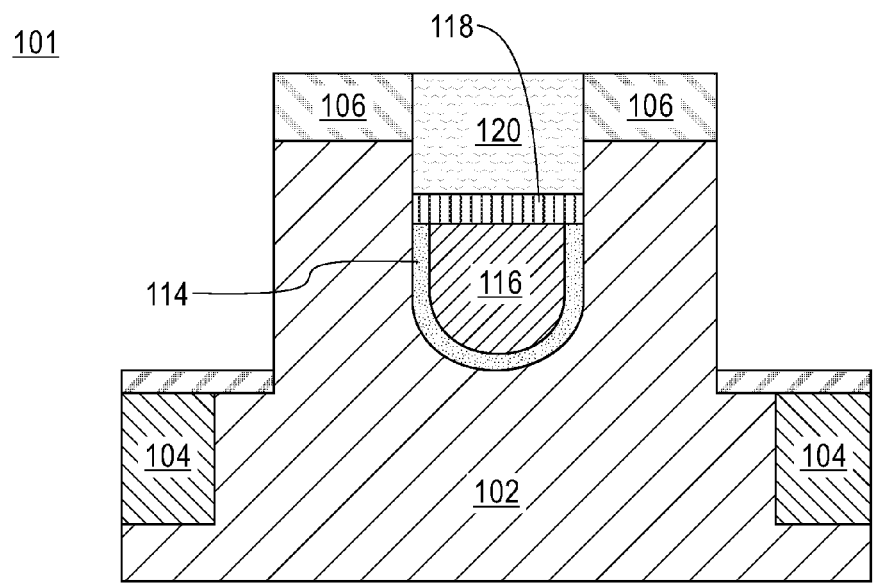

FIGS. 11A and 11B are cross-sectional views of a vertical channel transistor and a recessed channel gate transistor, respectively, depicting the fabrication process of gate electrode patterning, in accordance with an embodiment of the present invention.

In this exemplary embodiment, structure 100 and structure 101 are etched based on the deposition of gate electrode mask 122, using standard lithography and etching techniques known in the art. Gate electrode 116, formed on either side of vertical fin 103 (structure 100) and between wide fins 105 (structure 101), remains after the etching process.

Figure 12A:
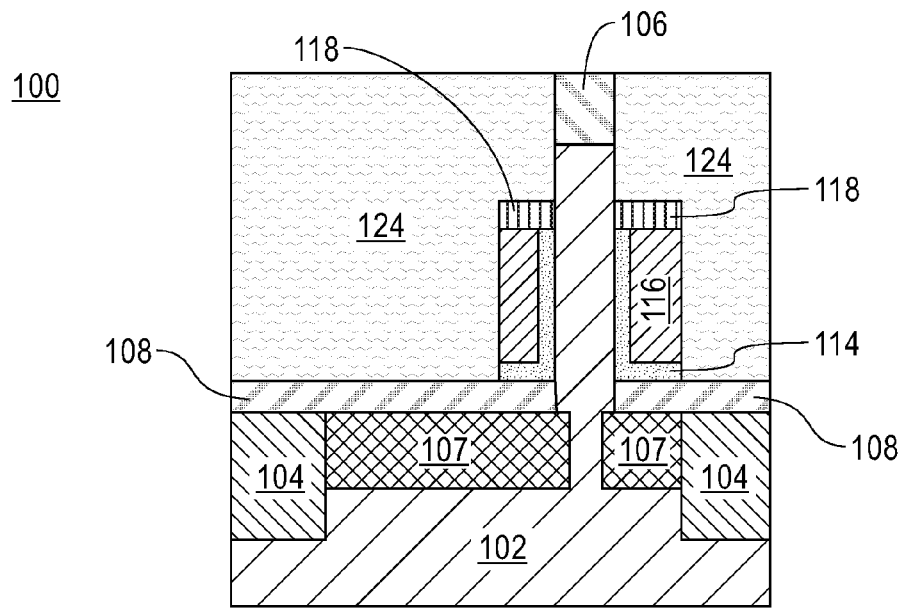
FIGS. 12A and 12B are cross-sectional views of a vertical channel transistor and a recessed channel gate transistor, respectively, depicting the fabrication process of a second ILD fill and CMP, in accordance with an embodiment of the present invention.
Figure 12B:
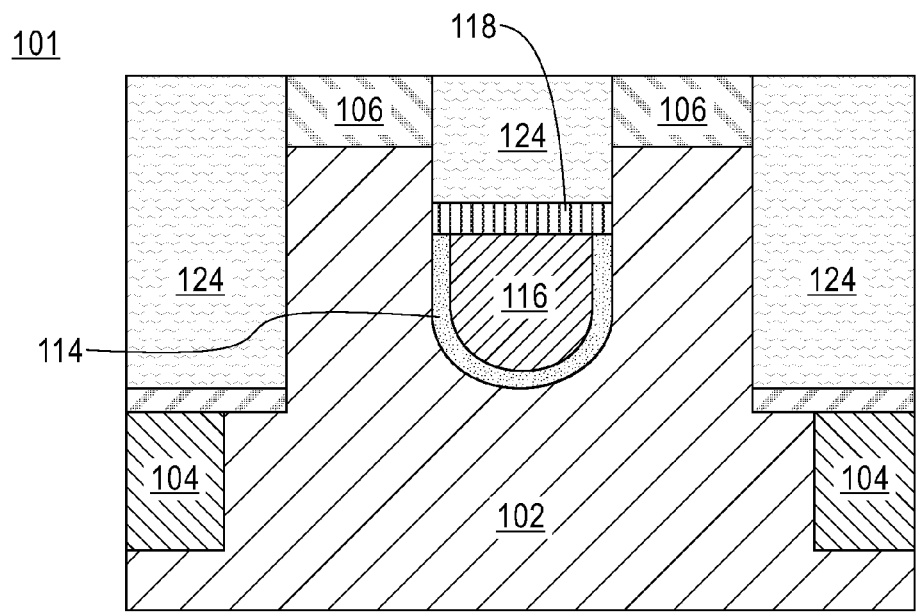

FIGS. 12A and 12B are cross-sectional views of a vertical channel transistor and a recessed channel gate transistor, respectively, depicting the fabrication process of a second ILD fill and CMP, in accordance with an embodiment of the present invention.

In this exemplary embodiment, in both structures 100 and 101, dielectric material 124 is deposited over the top surface of exposed bottom spacer 108 and top spacer 118, using a conventional deposition process, followed by a planarization process (e.g., chemical mechanical planarization) to expose the top surface of vertical fin 103 and wide fins 105. Dielectric material 124 can be an oxide material, which acts to separate later formed source and drain regions from the gate structure (i.e., gate dielectric material 114 and gate electrode 116).

Figure 13A:
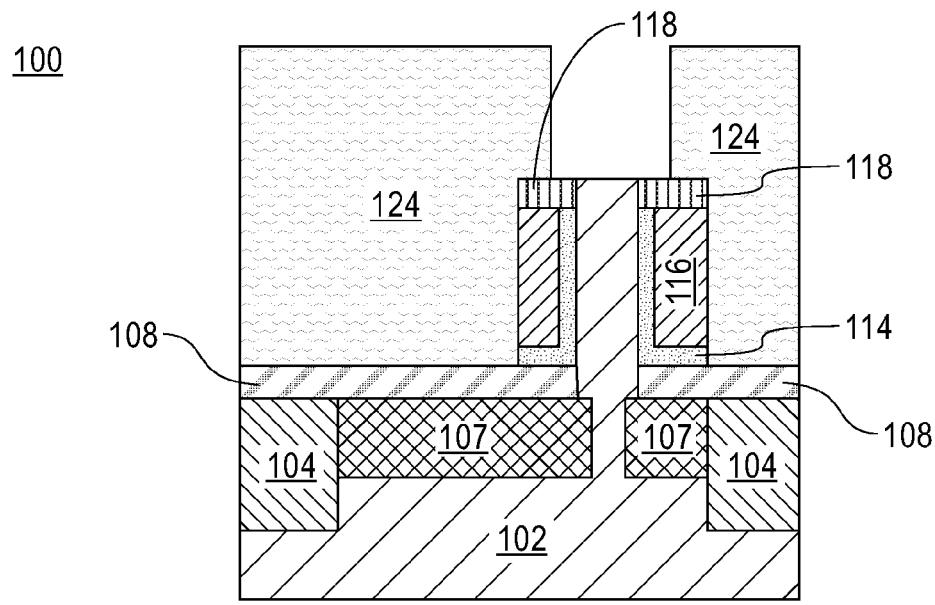
FIGS. 13A and 13B are cross-sectional views of a vertical channel transistor and a recessed channel gate transistor, respectively, depicting the fabrication process of FIN hard mask removal for top SD formation, in accordance with an embodiment of the present invention.
Figure 13B:
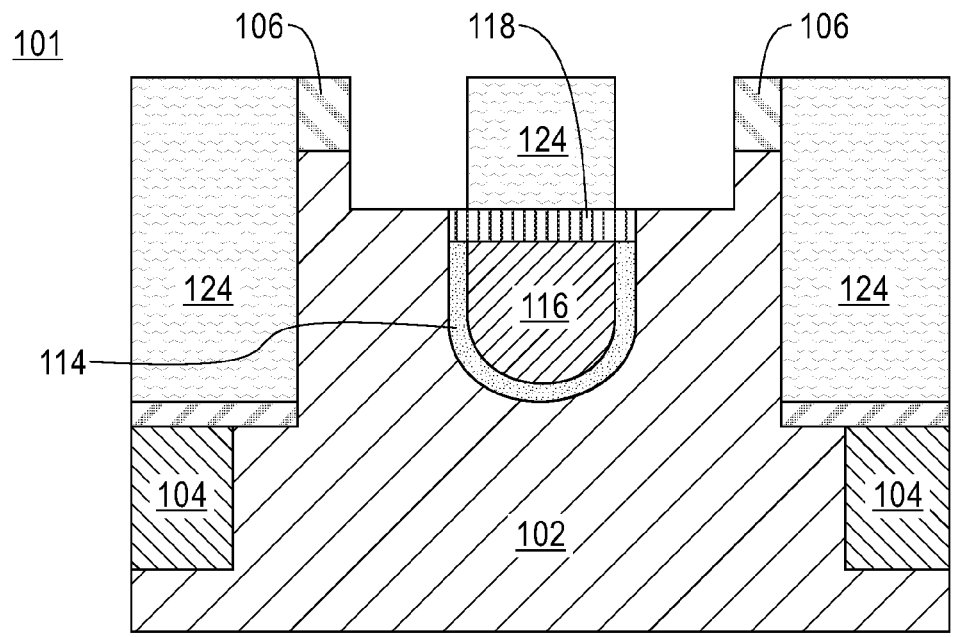

FIGS. 13A and 13B are cross-sectional views of a vertical channel transistor and a recessed channel gate transistor, respectively, depicting the fabrication process of FIN hard mask removal for top SD formation, in accordance with an embodiment of the present invention.

In this exemplary embodiment, conventional lithography and etching processes known in the art are used to remove hardmask 106 from structure 100 and structure 101, for top SD formation. In some embodiments, an additional top active region recess of wide fins 105 is performed, for later embedded SD epi growth. At the end of this processing step, hardmask 106 is completely removed from structure 100, while, optionally, some hardmask 106 remains in structure 101.

Figure 14A:
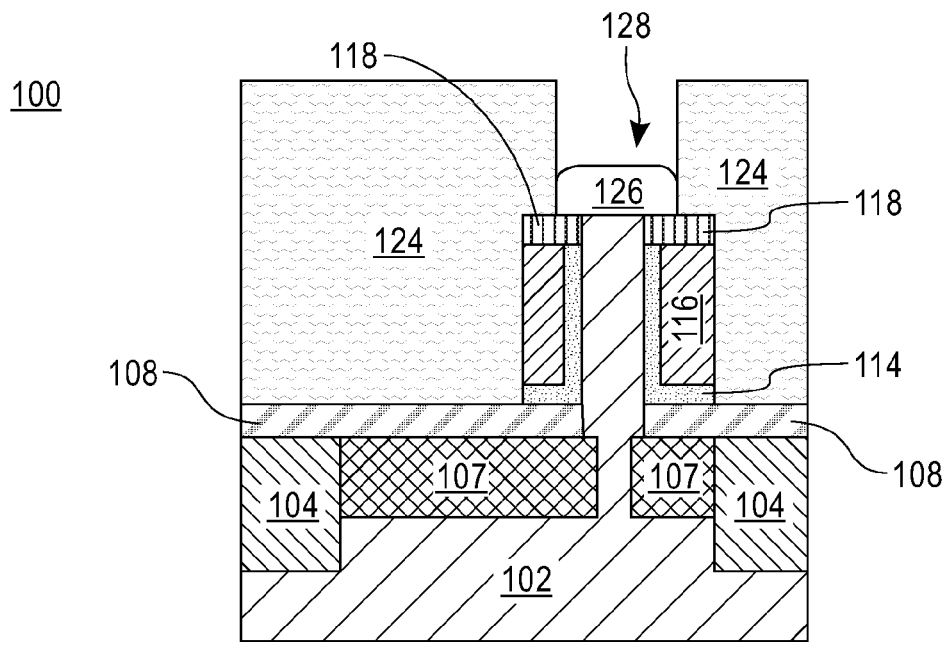
FIGS. 14A and 14B are cross-sectional views of a vertical channel transistor and a recessed channel gate transistor, respectively, depicting the fabrication process for top SD formation, in accordance with an embodiment of the present invention.
Figure 14B:
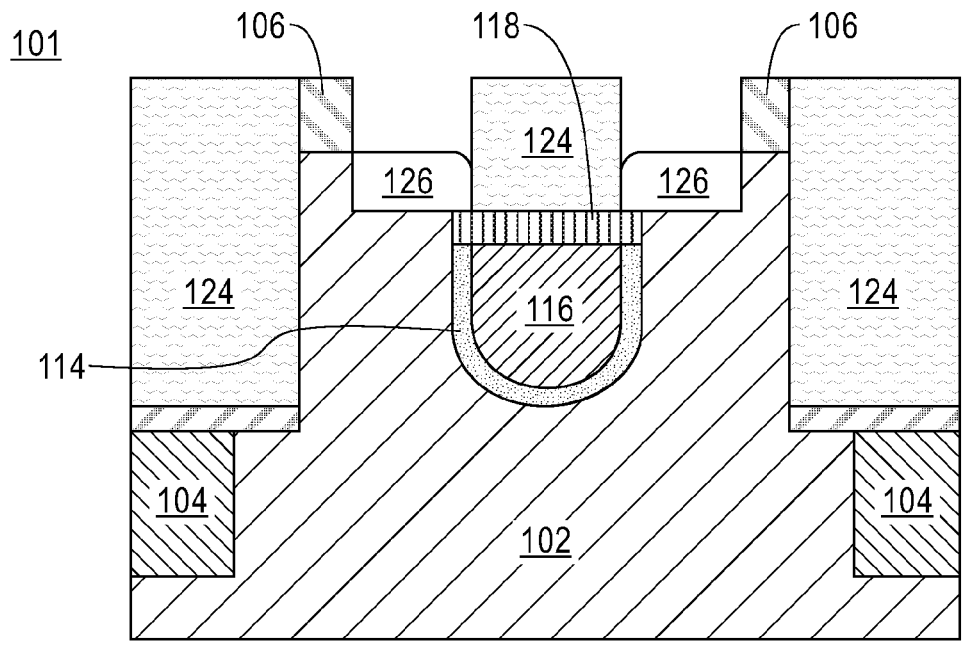

FIGS. 14A and 14B are cross-sectional views of a vertical channel transistor and a recessed channel gate transistor, respectively, depicting the fabrication process for top SD formation, in accordance with an embodiment of the present invention.

In this exemplary embodiment, top SD 126 is formed on the top surface of vertical fin 103 (structure 100) and wide fins 105 (structure 101) by an epitaxial growth process. Top SD 126 is used as the source or drain region of structures 100 and 101. In other embodiments, top SD 126 is formed using an ion implantation process, known in the art.

Figure 15A:
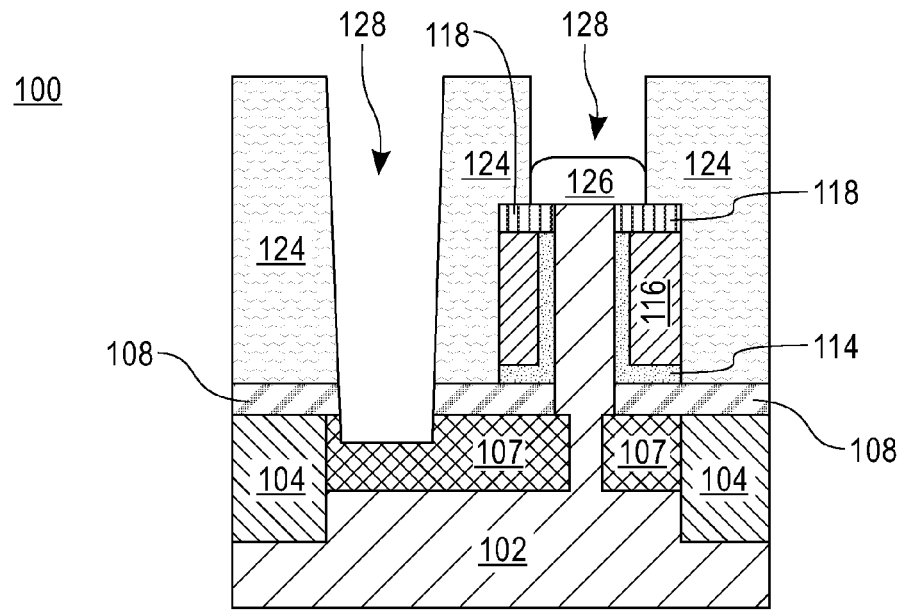
FIGS. 15A and 15B are cross-sectional views of a vertical channel transistor and a recessed channel gate transistor, respectively, depicting the fabrication process for SD contact patterning, in accordance with an embodiment of the present invention.
Figure 15B:
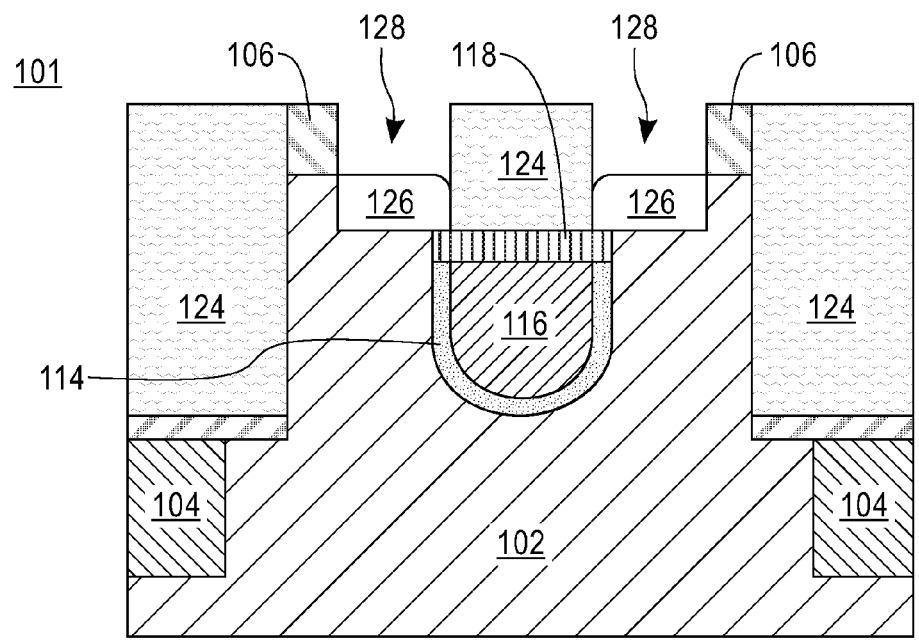

FIGS. 15A and 15B are cross-sectional views of a vertical channel transistor and a recessed channel gate transistor, respectively, depicting the fabrication process for SD contact patterning, in accordance with an embodiment of the present invention.

Figure 16A:
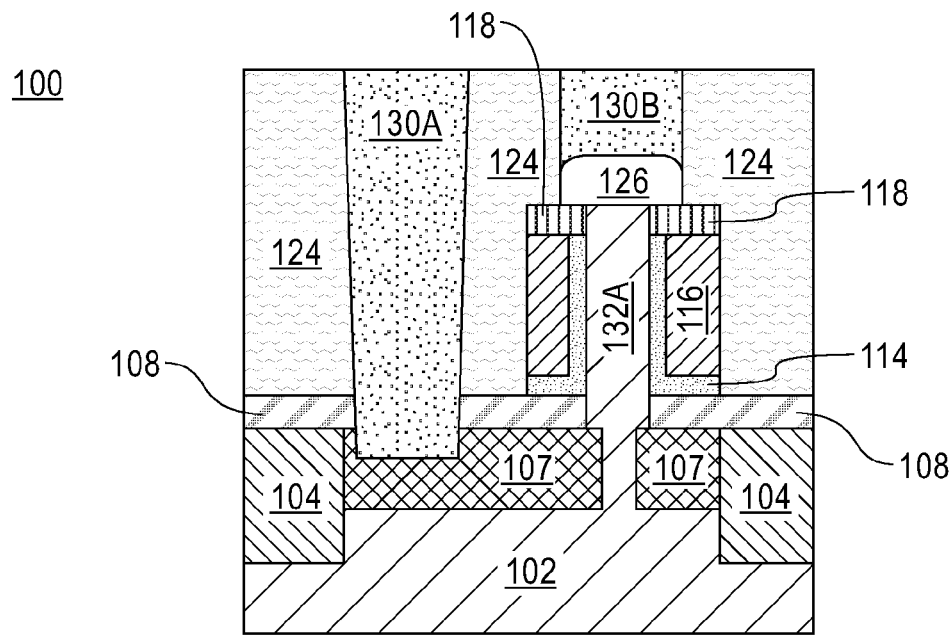
FIGS. 16A and 16B are cross-sectional views of a vertical channel transistor and a recessed channel gate transistor, respectively, after the fabrication process of SD contact formation, in accordance with an embodiment of the present invention.

In this exemplary embodiment, contact openings 128 are patterned on top of the top SD 126, using known lithography and etching processes (e.g., RIE processes). Subsequently, contacts 130 are formed. In this exemplary embodiment, contacts 130 are formed from a silicide process known in the art, in which a thin transition metal layer (e.g., platinum, cobalt, or nickel) are deposited over the patterned structure 100 and 101. After the deposition, the structures 100 and 101 are heated, which allows the transition metal to react with the exposed silicon in the active regions of structures 100 and 101 (i.e., top SD 126), which forms a low-resistance transition metal silicide. After the reaction, any remaining transition metal is removed using chemical etching, and only contacts 130 remain in the active region of structure 100 and 101 (as depicted in FIGS. 16A and B). In other embodiments, a metal deposition process known in the art is used to form contacts 130.

Figure 16B:
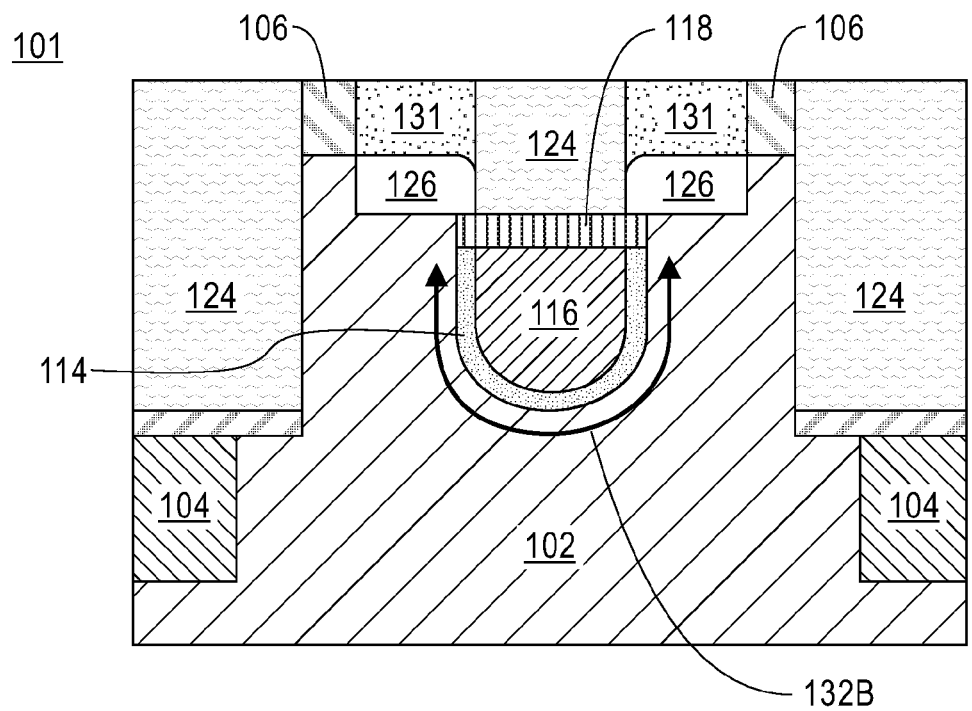
Figure 17A:
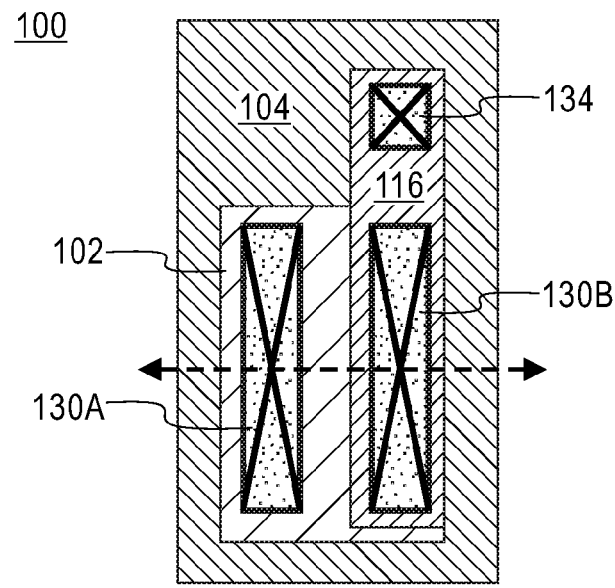
FIGS. 17A and 17B are plan views of a vertical channel transistor and a recessed channel gate transistor, respectively, after the fabrication process of SD contact formation, in accordance with an embodiment of the present invention.
Figure 17B:
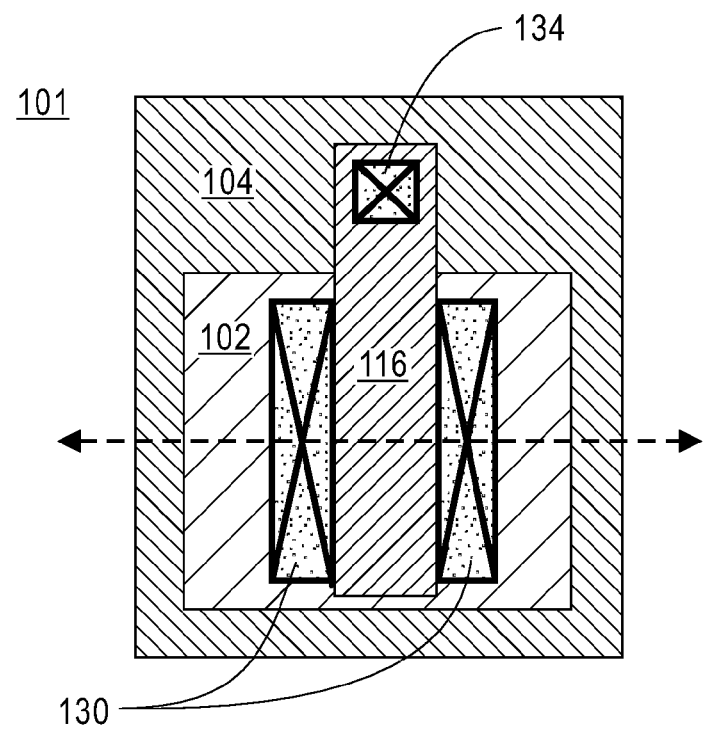

FIGS. 16A and 16B are cross-sectional views of a vertical channel transistor and a recessed channel gate transistor, respectively, after the fabrication process of SD contact formation, and FIGS. 17A and 17B are plan views of a vertical channel transistor and a recessed channel gate transistor, respectively, after the fabrication process of SD contact formation, in accordance with an embodiment of the present invention.

As depicted in FIG. 16B, a recessed channel gate transistor with a long, U-shaped channel 132B (in contrast to the vertical channel 132A of the resulting vertical channel transistor of FIG. 16A) results from the process steps of FIGS. 1-15. Using this process, an active region, gate, source and drain region, and contacts can be formed using processes similar to those of vertical channel transistor formation, with little additional processing required. Thus, embodiments of the present invention describe a fully compatible process integration for a short channel, vertical FET device and a recessed long channel device.

The plan view of the vertical channel transistor of FIG. 17A depicts gate contact 134 on gate electrode 116, and bottom SD contact 130A and top SD contact 130B. The plan view of the recessed channel gate transistor depicts gate contact 134 on gate electrode 116. SD contacts 130 are formed on both left and right sides of gate electrode 116, over the recess long channel (not visible in the plan view).

Having described the preferred embodiments of a method for fabricating a recessed long channel transistor (which are intended to be illustrative and not limiting), it is noted that modifications and variations may be made by persons skilled in the art in light of the above teachings. It is, therefore, to be understood that changes may be made in the particular embodiments disclosed which are within the scope of the invention, as outlined by the appended claims.

In certain embodiments, the fabrication steps depicted above may be included on a semiconductor substrate consisting of many devices and one or more wiring levels to form an integrated circuit chip. The resulting integrated circuit chip(s) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications, to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A method for co-integrating a short-channel vertical transistor and a long-channel transistor, the method comprising:
   from a starting substrate, forming a wide fin, wherein the wide fin comprises a wide active region;
   depositing a recess mask over a top surface of the starting substrate;
   recessing a long channel based on the deposited recess mask, wherein the long channel is recessed to align with a top surface of a bottom spacer;
   depositing a gate electrode and a gate material, to form a gate structure;
   forming SD contacts in an SD region of the long-channel transistor; and
   depositing the bottom spacer over the top surface of the starting substrate.

2. The method of claim 1, wherein recessing the long channel, comprises:
   forming the long channel using a variable etching width and a variable etching depth.

3. The method of claim 1, wherein recessing the long channel comprises: etching a U-shaped channel.

4. The method of claim 1, wherein depositing a recess mask over a top surface of the starting substrate further comprises:
   patterning an opening for forming the recessed long channel.

5. The method of claim 1, further comprising:
   etching the deposited gate electrode and the gate material to expose a top portion of the wide fin.

6. The method of claim 5, further comprising:
depositing a top spacer over a top surface of the exposed top portion of the gate electrode and the gate material.

7. The method of claim 6, further comprising:
depositing a gate electrode mask over the top surface of the wide fin.

8. The method of claim 7, further comprising:
etching the recess mask for removal; and
recessing a top active region of the wide fin.

9. The method of claim 1, wherein a top SD is formed on the top surface of the wide fin using an epitaxial growth process.

10. The method of claim 1, wherein a top SD is formed on the top surface of the wide fin using an ion implantation process.

* * * * *